(12) United States Patent
Kakiuchi et al.

(10) Patent No.: US 8,999,735 B2
(45) Date of Patent: Apr. 7, 2015

(54) METHOD AND APPARATUS FOR MANUFACTURING ORGANIC EL DEVICE

(71) Applicant: Nitto Denko Corporation, Ibaraki-shi, Osaka (JP)

(72) Inventors: Ryohei Kakiuchi, Ibaraki (JP); Satoru Yamamoto, Ibaraki (JP); Kanako Hida, Ibaraki (JP)

(73) Assignee: Nitto Denko Corporation, Ibaraki-shi (JP)

(*) Notice: Subject to any disclaimer, the term of this patent is extended or adjusted under 35 U.S.C. 154(b) by 0 days.

(21) Appl. No.: 14/115,793

(22) PCT Filed: Dec. 10, 2012

(86) PCT No.: PCT/JP2012/081975
§ 371 (c)(1),
(2) Date: Nov. 5, 2013

(87) PCT Pub. No.: WO2013/099578
PCT Pub. Date: Jul. 4, 2013

(65) Prior Publication Data
US 2014/0084276 A1   Mar. 27, 2014

(30) Foreign Application Priority Data

Dec. 27, 2011  (JP) ................. 2011-285561
Dec. 5, 2012   (JP) ................. 2012-266748

(51) Int. Cl.
*H01L 21/00* (2006.01)
*H01L 51/50* (2006.01)
*H01L 51/56* (2006.01)
*H01L 51/00* (2006.01)
*C23C 14/04* (2006.01)
*C23C 14/56* (2006.01)

(52) U.S. Cl.
CPC .......... *H01L 51/5012* (2013.01); *H01L 51/56* (2013.01); *H01L 51/001* (2013.01); *C23C 14/042* (2013.01); *C23C 14/562* (2013.01)

(58) Field of Classification Search
CPC ..... H01L 51/56; H01L 51/001; C23C 14/042; C23C 14/562
USPC ................. 438/22, 47; 118/718
See application file for complete search history.

(56) References Cited

U.S. PATENT DOCUMENTS

2004/0258997 A1* 12/2004 Utsugi et al. ........... 429/232

FOREIGN PATENT DOCUMENTS

| JP | 2000-183500 A | 6/2000 |
| JP | 2011-194667 A | 10/2011 |
| WO | 2011/021622 A1 | 2/2011 |

OTHER PUBLICATIONS

International Search Report of PCT/JP2012/081975, mailing date of Mar. 12, 2013.

(Continued)

*Primary Examiner* — Laura Menz
(74) *Attorney, Agent, or Firm* — Westerman, Hattori, Daniels & Adrian, LLP

(57) ABSTRACT

Provided are a method and an apparatus for manufacturing an organic EL device which enable deposition of a vaporized material from an evaporation source onto a substrate in a desired pattern, while eliminating the need for a conventional strip-shaped shadow mask. A shielding portion 51 is configured to be switchable between a shield position where the shielding portion 51 is arranged between an evaporation source 4 and a substrate 81 so as to shield the substrate 81 and a shield release position where the shielding portion 51 is withdrawn from between the evaporation source 4 and the substrate 81 so as to release the shielding of the substrate 81. The shielding portion 51 is switched between the shield position and the shield release position while rotating together with a roller 3.

6 Claims, 20 Drawing Sheets

(56) References Cited

OTHER PUBLICATIONS

Notification of Transmittal of Translation of the International Preliminary Report on Patentability (form PCT/IB/338) dated Jul. 10, 2014, issued in International Application No. PCT/JP2012/081975, with forms PCT/IB/373, PCT/ISA/237 (w/English translation) and PCT/IB/326 (11 pages).

* cited by examiner

F I G. 1
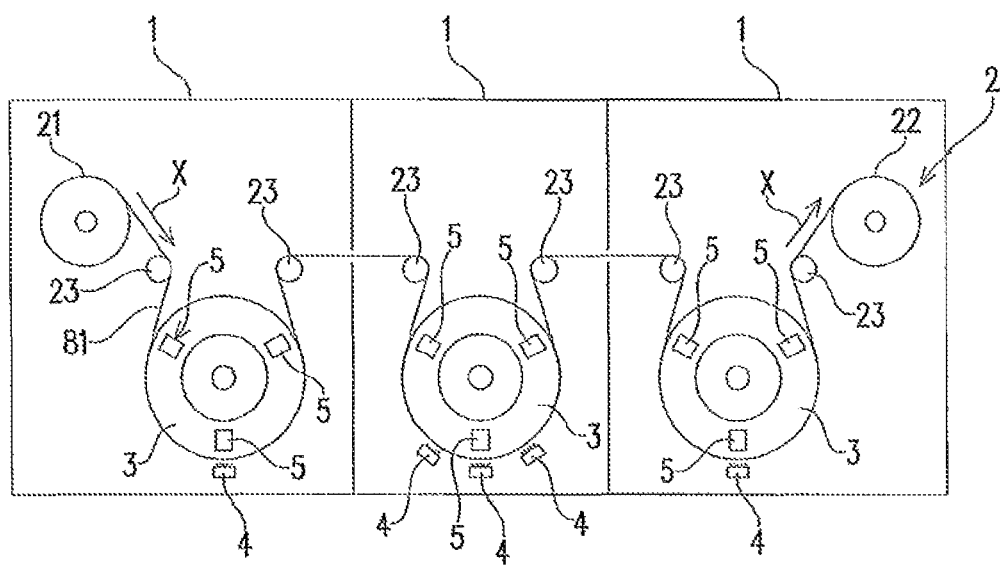

F I G. 2
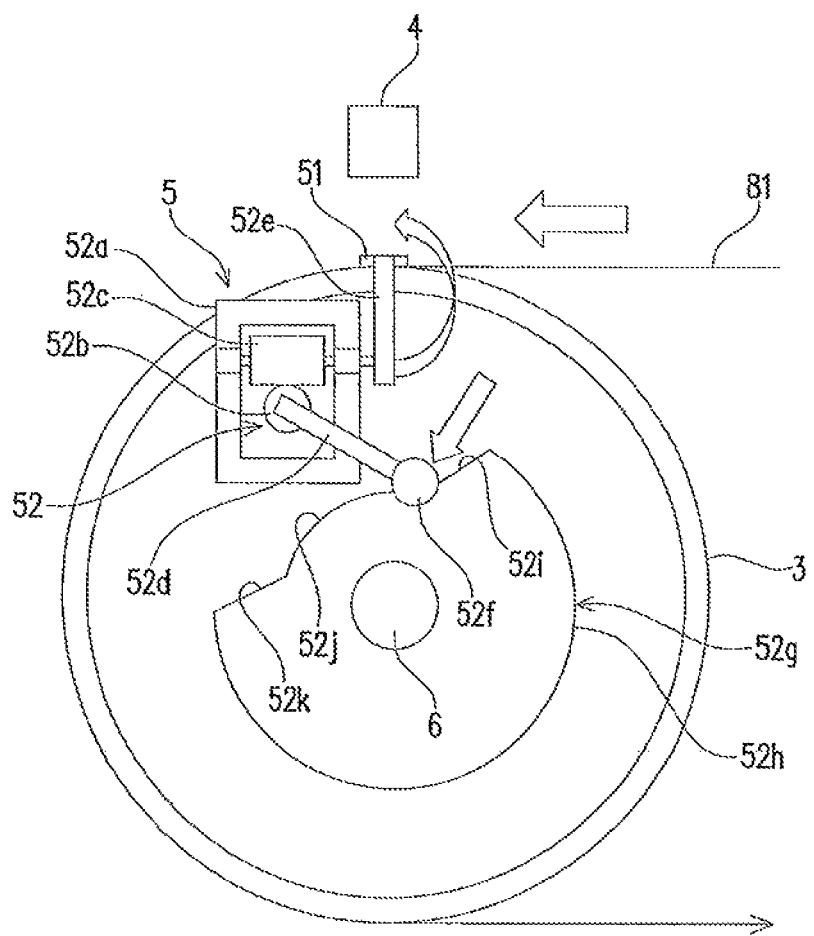

F I G. 8
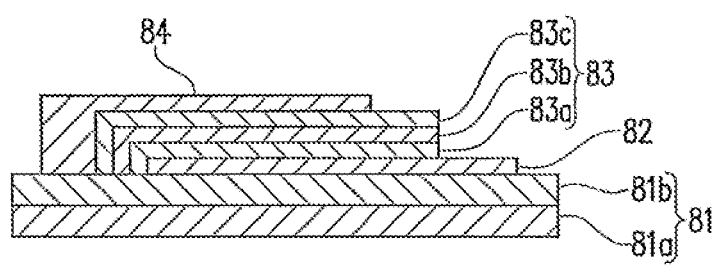

F I G. 1 1
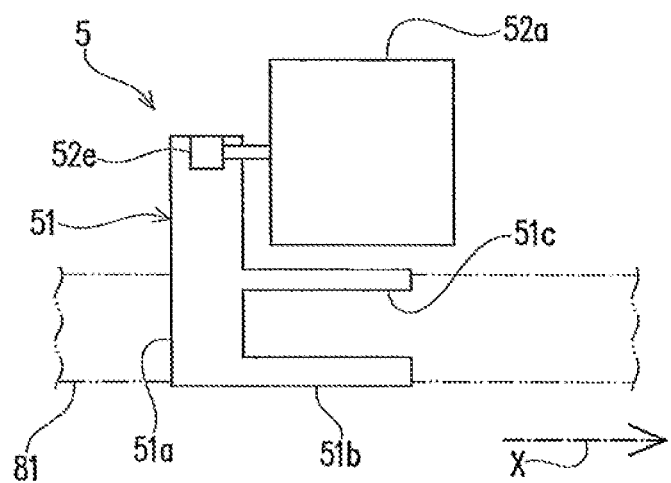

F I G. 1 2
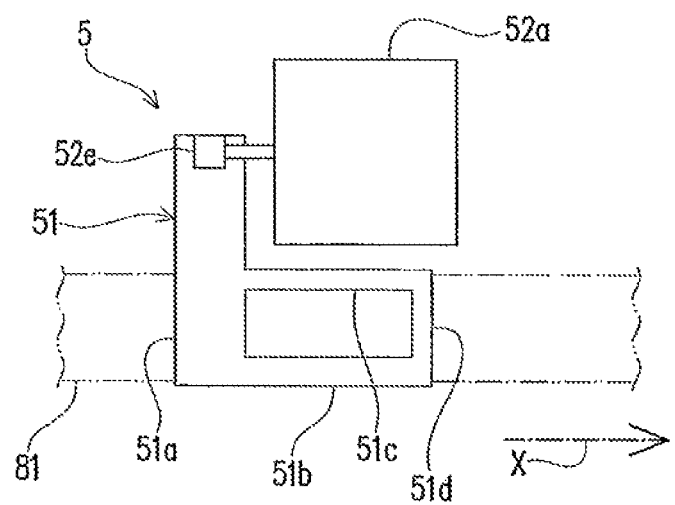

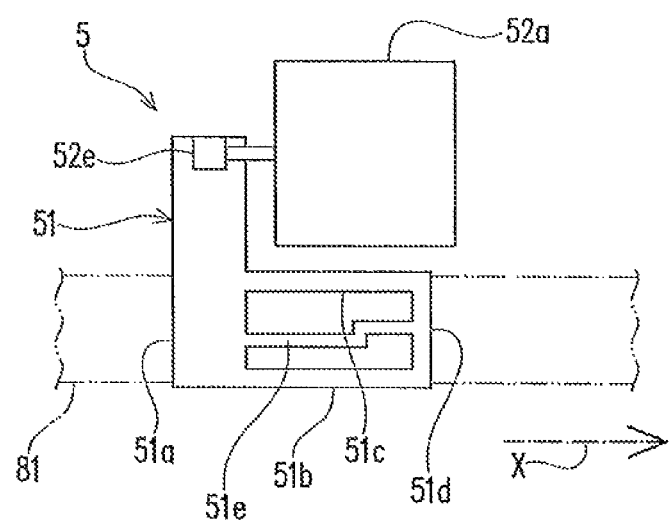
F I G. 13

F I G. 1 7
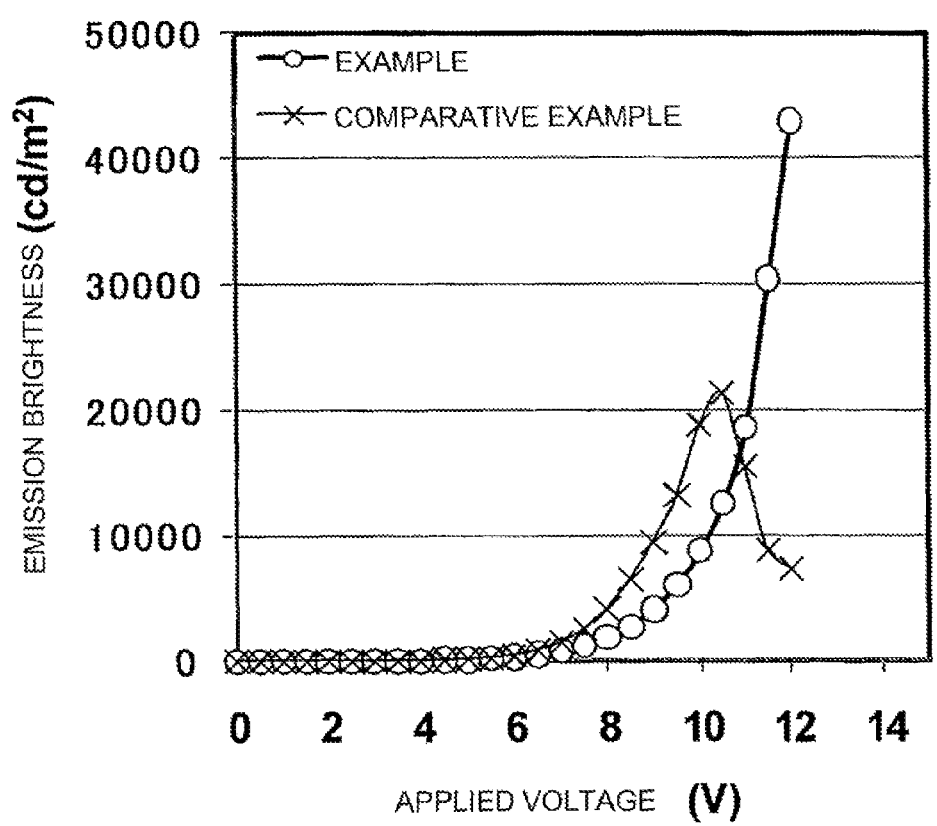

F I G. 1 8
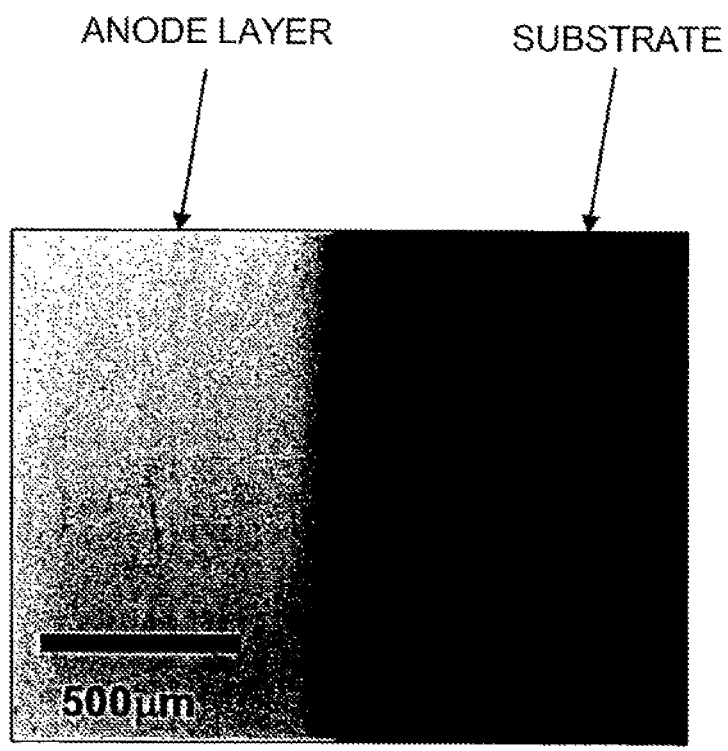

METHOD AND APPARATUS FOR MANUFACTURING ORGANIC EL DEVICE

FIELD OF THE INVENTION

The present invention relates to a method for manufacturing an organic EL (electroluminescence) device formed by deposition of a vaporized material from an evaporation source onto a substrate having a strip shape, and to an apparatus for manufacturing the organic EL device.

BACKGROUND ART

Conventionally, a manufacturing method that includes the steps of; transporting a substrate having a strip shape so that the substrate is transported along a specific transporting direction; and depositing a vaporized material discharged from an evaporation source onto the substrate is known as a method for manufacturing an organic EL device (see, for example, Patent Literature 1). According to such a manufacturing method, a strip-shaped shadow mask is brought into surface-to-surface close contact with the substrate having a strip shape, and the shadow mask is transported integrally with the substrate, thereby depositing the vaporized material onto the substrate in a desired pattern.

CITATION LIST

Patent Literature 1: JP 2000-183500 A

SUMMARY OF INVENTION

Technical Problem

In the manufacturing method according to Patent Literature 1, a feed-out roller that feeds out the shadow mask, a take-up roller that winds up the shadow mask, and a plurality of support rollers that support the shadow mask are provided in an apparatus, and thus there is generally a problem of an increase in size of the apparatus. Further, in the case of deposition of the vaporized material onto the substrate in a different pattern, there is a need for complex operation to replace the shadow mask with another one (pattern switching), which is a problem.

In view of such circumstances, it is an object of the present invention to provide a method and an apparatus for manufacturing an organic EL device which allow deposition of a vaporized material from an evaporation source onto a substrate in a desired pattern, while eliminating the need for such a conventional strip-shaped shadow mask.

Solution to Problem

According to the present invention, there is provided a method for manufacturing an organic EL device, which includes the steps of; conveying a substrate having a strip shape while the substrate is in contact with a roller; depositing a vaporized material onto a predetermined part of the substrate by discharging the vaporized material from an evaporation source; and arranging a shielding portion for shielding the substrate between the evaporation source and the substrate so as to prevent the deposition of the vaporized material onto the part other than the predetermined part during the deposition of the vaporized material, wherein the shielding portion is switchable between a shield position where the shielding portion is arranged between the evaporation source and the substrate so as to shield the substrate and a shield release position where the shielding portion is withdrawn from between the evaporation source and the substrate so as to release the shielding of the substrate, and wherein the shielding portion is switched between the shield position and the shield release position while rotating together with the roller.

The method for manufacturing an organic EL device according to the present invention allows deposition of the vaporized material onto a predetermined part by the shielding portion being arranged between the evaporation source and the substrate, while preventing deposition of the vaporized material onto the part other than the predetermined part.

The shielding portion is then withdrawn from between the evaporation source and the substrate, and thereby the shielding portion is switched to the shield release position so as to release the shielding of the substrate. This makes it possible to return the shielding portion to the original position, without preventing the deposition of the vaporized material discharged from the evaporation source onto the substrate that is being transported. Accordingly, organic EL devices can be produced continuously by repeating such an operation.

In the method for manufacturing an organic EL device according to the present invention, the shielding portion may have a larger dimension than the width dimension of the substrate so as to be arranged across the width direction of the substrate when being located at the shield position.

This method for manufacturing an organic EL device allows a part onto which no vaporized material is deposited to be formed across the width direction of the substrate. Therefore, the organic EL device can be cut into pieces along such a part in a subsequent step.

Further, in the method for manufacturing an organic EL device according to the present invention, the shielding portion is desirably a flip-type shield plate.

According to this method for manufacturing an organic EL device, use of a flip-type shield plate as the shielding portion enables its position to be switched between the shield position and the shield release position without failure.

According to the present invention, there is also provided an apparatus for manufacturing an organic EL device, which includes: a roller in contact with a substrate having a strip shape; an evaporation source for discharging a vaporized material toward a predetermined part of the substrate so that the vaporized material is deposited onto the substrate; and a shielding unit for shielding the substrate so as to prevent the deposition of the vaporized material onto the part other than the predetermined part, wherein the shielding unit includes: a shielding portion for shielding the substrate; and a switching mechanism capable of switching the shielding portion between a shield position where the shielding portion is arranged between the evaporation source and the substrate so as to shield the substrate and a shield release position where the shielding portion is withdrawn from between the evaporation source and the substrate so as to release the shielding of the substrate, wherein the shielding portion is switched between the shield position and the shield release position by the switching mechanism while rotating together with the roller.

According to such an apparatus for manufacturing an organic EL device, the shielding portion is located at the shield position so as to shield the substrate by being arranged between the evaporation source and the substrate. This allows deposition of the vaporized material onto a predetermined part of the substrate, while preventing the deposition of the vaporized material onto the part other than the predetermined part.

The shielding portion is then withdrawn from between the evaporation source and the substrate, and thereby the shielding portion is switched to the shield release position so as to release the shielding of the substrate. This makes it possible to return the shielding portion to the original position. Accordingly, organic EL devices can be produced continuously by repeating such an operation.

Advantageous Effects of Invention

As described above, the present invention exerts an excellent effect that enable deposition of a vaporized material from an evaporation source onto a substrate in a desired pattern, while eliminating the need for a conventional strip-shaped shadow mask.

BRIEF DESCRIPTION OF DRAWINGS

FIG. 1 is a schematic front view of an apparatus for manufacturing an organic EL device according to one embodiment of the present invention.

FIG. 2 is a side view of a main part of the apparatus for manufacturing an organic EL device according to the one embodiment.

FIG. 8 is an enlarged sectional view taken along the line VIII-VIII of FIG. 6.

FIG. 11 is a plan view of a main part of an apparatus for manufacturing an organic EL device according to another embodiment of the present invention.

FIG. 12 is a plan view of a main part of an apparatus for manufacturing an organic EL device according to another embodiment of the present invention.

FIG. 13 is a plan view of a main part of an apparatus for manufacturing an organic EL device according to another embodiment of the present invention.

FIG. 17 is a graph demonstrating the effects of Examples and Comparative Examples of an organic EL device.

FIG. 18 is a partial planar image of Examples of the organic EL device according to the present invention.

DESCRIPTION OF EMBODIMENTS

Figure 3:
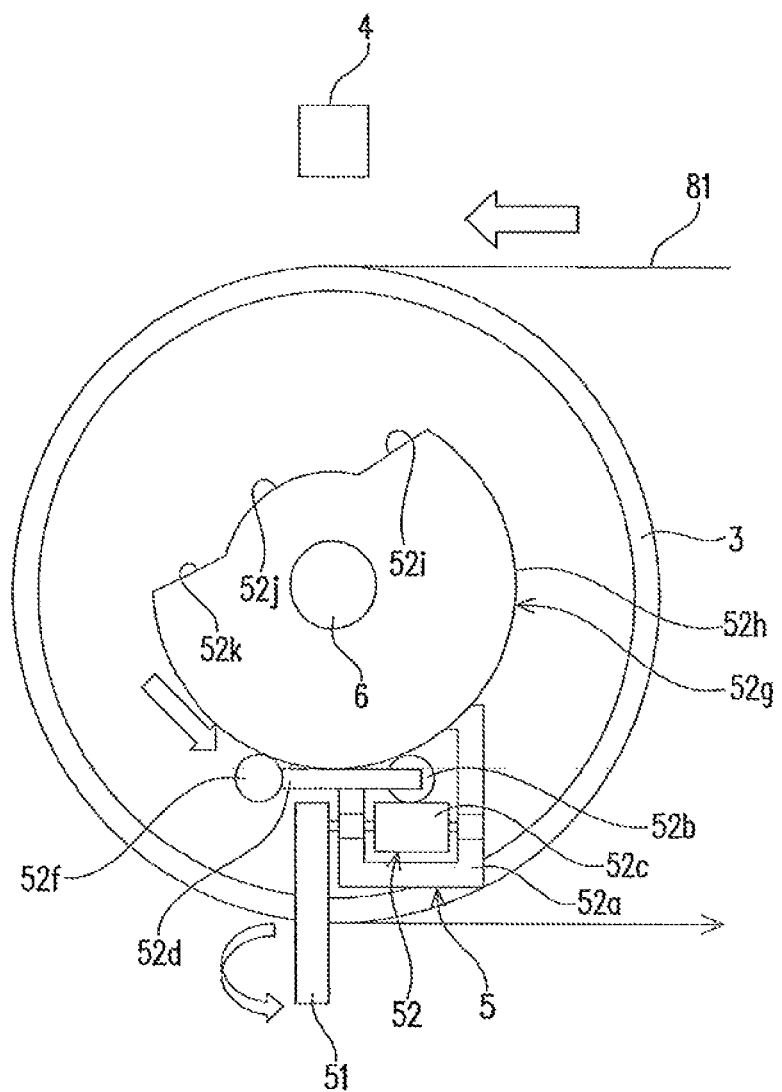
FIG. 3 is a side view of a main part of the apparatus for manufacturing an organic EL device according to the one embodiment.
Figure 4:
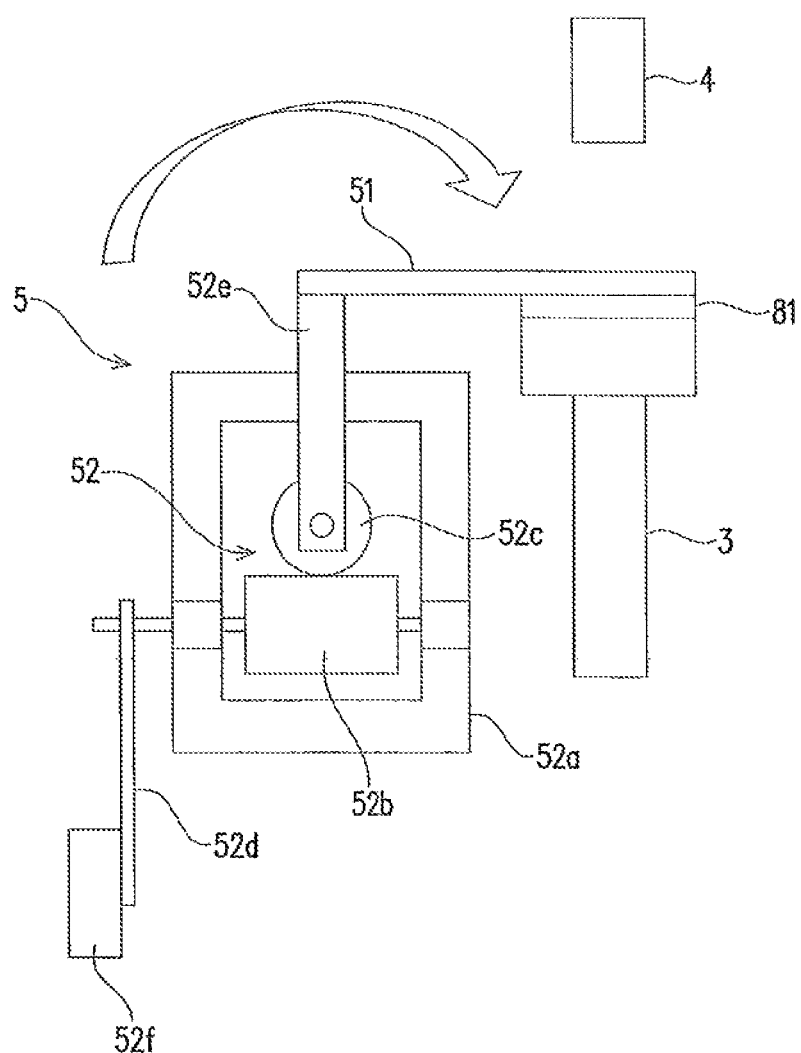
FIG. 4 is a side sectional view of a main part of the apparatus for manufacturing an organic EL device according to the one embodiment.
Figure 5:
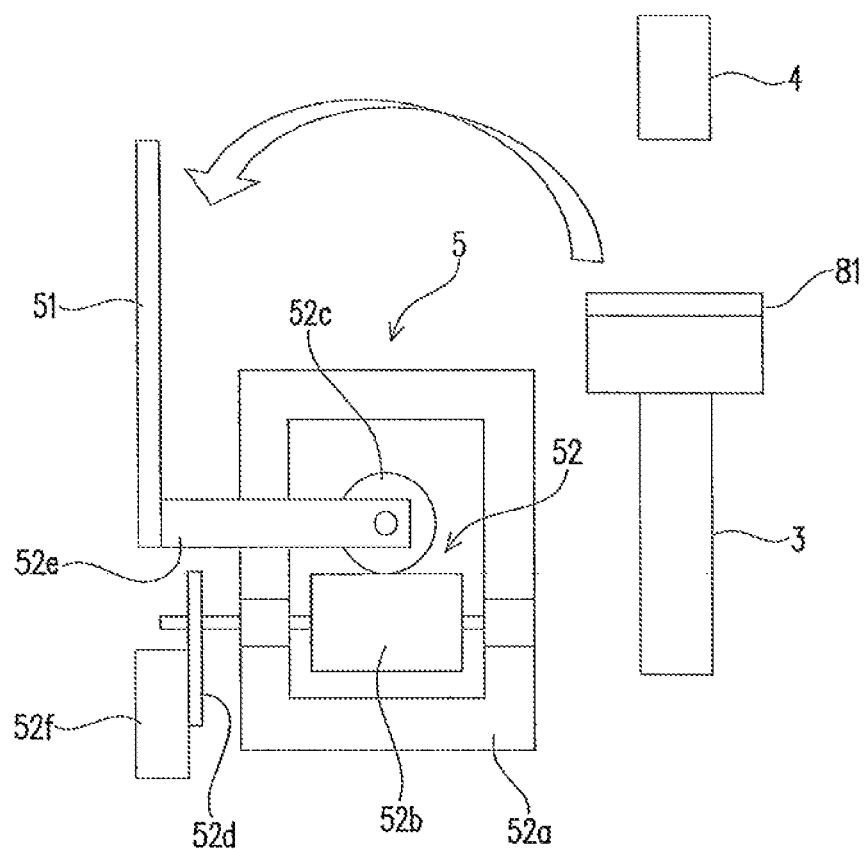
FIG. 5 is a side sectional view of a main part of the apparatus for manufacturing an organic EL device according to the one embodiment.

Hereinafter, the apparatus for manufacturing an organic EL device according to one embodiment of the present invention (hereinafter, simply referred to also as the "manufacturing apparatus") is described with reference to FIGS. 1 to 5.

The manufacturing apparatus according to the present invention includes: a plurality of vacuum chambers 1 inside of which are in a vacuum state; a transporting unit 2 that transports a substrate 81 having a strip shape along a specific direction (hereinafter referred to also as a "transporting direction") X so that the substrate 81 passes through the inside of the vacuum chambers 1; a plurality of can rollers 3 provided in an intermediate portion of the conveying path of the substrate 81 while being in contact with the substrate 81; a plurality of evaporation sources 4 that discharge a vaporized material toward the substrate 81; and shielding units 5 that are each provided integrally with the corresponding can roller 3 and shields the substrate 81 that is in contact with the can roller 3 from the corresponding evaporation source 4 at a specific position.

Three vacuum chambers 1 are provided herein. The plurality of vacuum chambers 1 are provided in series along the transporting direction X. Further, each of the vacuum chambers 1 is connected to a vacuum generating unit such as a vacuum pump (not shown or numbered) so that the inside of the vacuum chamber 1 is brought into a vacuum state.

The transporting unit 2 includes a feed-out roller 21 that feeds out the substrate 81, a take-up roller 22 that winds up the substrate 81 (specifically, an organic EL device 8 formed by deposition of the vaporized material onto the substrate 81), and a plurality of support rollers 23 that are arranged between the feed-out roller 21 and the take-up roller 22 and that support the substrate 81. The transporting unit 2 transports the substrate 81 so that the substrate 81 has a portion that extends linearly along the transporting direction X.

The feed-out roller 21 is arranged inside the vacuum chambers 1 on the upstream side thereof, whereas the take-up roller 22 is arranged inside the vacuum chambers 1 on the downstream side thereof. Further, the plurality of support rollers 23 are arranged inside the vacuum chambers 1 and aligned along the transporting direction X. The plurality of support rollers 23 are hung with the substrate 81 and support the substrate 81.

The evaporation sources 4 are respectively arranged inside the vacuum chambers 1 in the radial directions of the can rollers 3 so as to face the substrate 81. One of the evaporation sources 4 is provided in each of the upstream and downstream vacuum chambers 1, and three of the evaporation sources 4 are provided in the middle vacuum chamber 1, aligned along the transporting direction X in the vacuum chamber 1. Each evaporation source 4 discharges a vaporized material that has been vaporized by heating toward the substrate 81.

The shielding unit 5 includes: a shielding portion 51 that shields the substrate 81; and a switching mechanism 52 that switches the position of the shielding portion 51 by rotationally moving the shielding portion 51. The switching mechanism 52 is configured to be switchable between a shield position where the shielding portion 51 is arranged between each evaporation source 4 and the substrate 81 so as to shield the substrate 81 and a shield release position where the shielding portion 51 is withdrawn from between the evaporation source 4 and the substrate 81 so as to release the shielding of the substrate 81.

Each shielding portion 51 serves not only to allow deposition of a specific vaporized material discharged from the corresponding evaporation source 4 onto a predetermined part over which an organic EL device is intended to be formed, but also to shield the part other than the predetermined part so as to prevent deposition of the vaporized material thereon. Here, "the part other than the predetermined part" denotes the part of the substrate 81 that overlaps the shielding portion 51 when the shielding portion 51 is overlapped by the substrate 81 for shielding. The shielding portion 51 is formed into a plate in a strip shape or a rectangular shape. More specifically, a so-called flip-type shield plate is employed as the shielding portion 51 in this embodiment. The flip-type shield plate is of the type that is driven to rotate so as to move toward and away from the substrate substantially in the normal direction of the can rollers 3, particularly at the closest position to the substrate 81. In addition to the flip-type shield plate, a so-called slide-type shield plate that is driven to rotate so as to move toward and away from the substrate 81 by moving substantially in the tangential direction of the can roller 3 also can be employed as the shielding portion 51. The shielding portion 51 has a larger dimension in the longitudinal direction than the width dimension of the substrate 81 so as to be arranged across the width direction of the substrate 81 when being located at the shield position.

The shielding portion 51 when being located at the shield position is arranged at a distance from the substrate 81. The distance between the shielding portion 51 and the substrate 81 is desirably 1 mm or less, for example. It is also possible to arrange the shielding portion 51 when being located at the shield position so as to be in contact with the substrate 81.

Each switching mechanism 52 includes a body 52a fixed to the corresponding can roller 3. Further, the switching mechanism 52 includes: a first rotating member 52b that is fixed to the body 52a so as to rotate around a shaft in parallel to a drive shaft 6 of the can roller 3; and a second rotating member 52c that is fixed to the body 52a so as to rotate around a shaft arranged along a direction orthogonal to the shaft of the first rotating member 52b and that is driven by the first rotating member 52b.

The switching mechanism 52 includes: a first linking member 52d having one end portion coupled to the shaft of the first rotating member 52b; and a second linking member 52e having one end portion coupled to the shaft of the second rotating member 52c and the other end portion coupled to the end portion of the shielding portion 51. The switching mechanism 52 further includes: a cam follower 52f that is rotatably attached to the other end portion of the first linking member 52d; and a cam 52g that is in sliding contact with the cam follower 52f.

A magnetic body is provided inside each of the first rotating member 52b and the second rotating member 52c. This causes the second rotating member 52c to rotate with the rotation of the first rotating member 52b because the magnetic body of the second rotating member 52c receives a magnetic force from the magnetic body of the first rotating member 52b. The first rotating member 52b and the second rotating member 52c are arranged at a distance from each other.

The cam 52g is formed into a circular plate. The cam 52g is arranged concentrically with the drive shaft 6 for driving the can roller 3. However, the cam 52g does not rotate together with the drive shaft 6 or the can roller 3, and is held within the vacuum chamber 1.

The cam 52g includes: a first region 52h for maintaining the shielding portion 51 at the shield release position; a second region 52i for moving the shielding portion 51 from the shield release position to the shield position; a third region 52j for maintaining the shielding portion 51 at the shield position; and a fourth region 52k for moving the shielding portion 51 from the shield position to the shield release position.

The first region 52h has a cam surface that is arcuate in side view with a specific radius of curvature on the outer circumferential surface of the circular plate shaped cam. The second region 52i has a cam surface that is linear in side view and that is inclined at a specific angle. The second region 52i has one end portion connected to one end portion of the arcuate first region 52h.

The third region 52h has a cam surface that is arcuate in side view with a specific radius of curvature. The radius of curvature of the third region 52j is set smaller than that of the first region 52h. The third region 52j has one end portion connected to the other end portion of the second region 52i.

The fourth region 52k has a cam surface that is linear in side view and that is inclined at a specific angle. The inclination direction of the fourth region 52k is set opposite to that of the second region 52i. The fourth region 52k has one end portion connected to the other end portion of the third region 52j. The fourth region 52k has the other end portion connected to the other end portion of the first region 52h.

The cam follower 52f is configured to move sequentially from the first region 52h to the fourth region 52k of the cam 52g.

The switching mechanism 52 includes a biasing unit (not shown or numbered) by which the cam follower 52f is biased so as to be kept in contact with each region (the first region 52h to the fourth region 52k) of the cam 52g.

The configuration of the apparatus for manufacturing an organic EL device according to this embodiment has been described above. Next, the method for manufacturing an organic EL device according to this embodiment is described.

First, the substrate 81 is conveyed from the feed-out roller 21 toward the take-up roller 22. At this time, the substrate 81 is conveyed while being in contact with each can roller 3 provided in the corresponding vacuum chamber 1. The shielding unit 5 provided in each can roller 3 moves the shielding portion 51 from the shield release position to the shield position, and shields a predetermined part of the substrate 81 from the evaporation source 4.

The shielding portion 51 rotates around the drive shaft 6 of the can roller 3 together with the can roller 3. The shielding portion 51 is started to move from the shield release position (see FIG. 5) to the shield position (see FIG. 4) when the cam follower 52f has moved from the first region 52h to the second region 52i of the cam 52g. The shielding unit 5 moves the cam follower 52g to the third region 52j along the second region 52i, thereby causing the first linking member 52d to pivotally move around the rotation shaft of the first rotating member 52b, together with which the first rotating member 52b rotates. Further, the first rotating member 52b rotates, together with which the second rotating member 52c rotates. At this time, in association with the motion of the second rotating member 52c, the second linking member 52e pivotally moves around the rotation shaft of the second rotating member 52c. This causes the shielding portion 51 to move from the shield release position to the shield position.

While the cam follower 52f moves from the second region 52i to the third region 52j and then moves along the third region 52j, the first linking member 52d does not pivotally move. Accordingly, the shielding portion 51 is maintained at the shield position. This prevents deposition of the vaporized material onto the part other than a predetermined part on which the vaporized material is supposed to be deposited, of the substrate 81 shielded by the shielding portion 51.

When the cam follower 52f has moved from the third region 52j to the fourth region 52k, the shielding portion 51 is started to move away from the shield position to the shield release position. The cam follower 52f moves along the fourth region 52k, thereby allowing the first linking member 52d to pivotally move around the rotation shaft of the first rotating member 52c. At this time, the first linking member 52d pivotally moves in a direction opposite to the direction in which it pivotally moves when the cam follower 52f moves within the second region 52i. In association with this pivotal motion of the first linking member 52d, the first rotating member 52b and the second rotating member 52c rotate, and also the second linking member 52e pivotally moves. This causes the shielding portion 51 to move from the shield position to the shield release position.

Thereafter, the cam follower 52f moves from the fourth region 52k to the first region 52h. While the cam follower 52f moves along the fourth region 52k, the first linking member 52d does not rotate. Accordingly, the shielding portion 51 is maintained at the shield release position.

Figure 6:
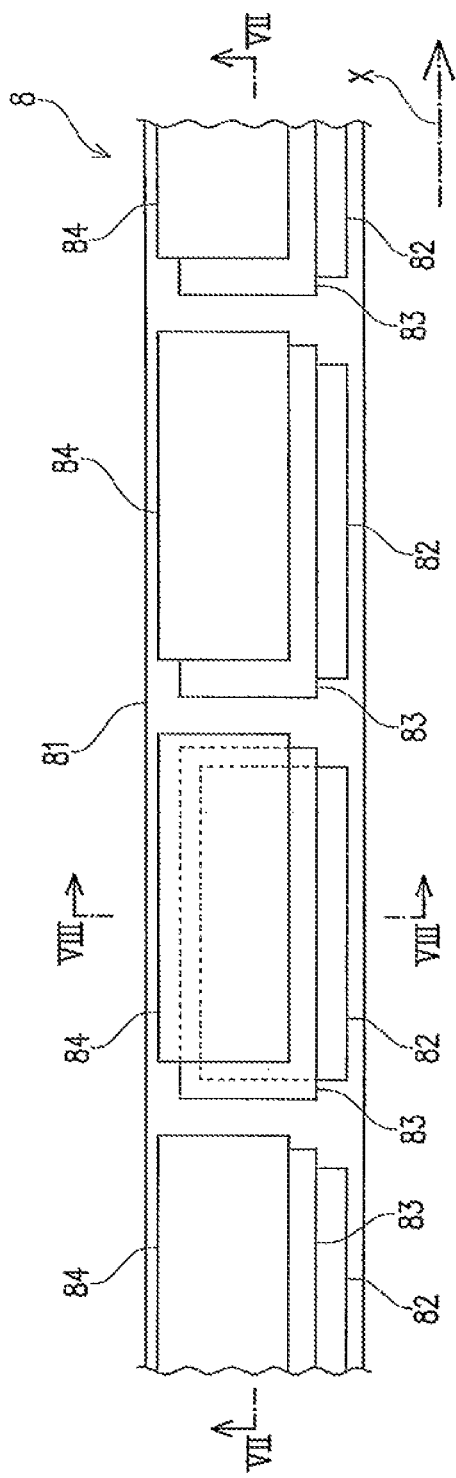
FIG. 6 is a plan view of a main part of an organic EL device manufactured by a manufacturing method according to the one embodiment.
Figure 7:
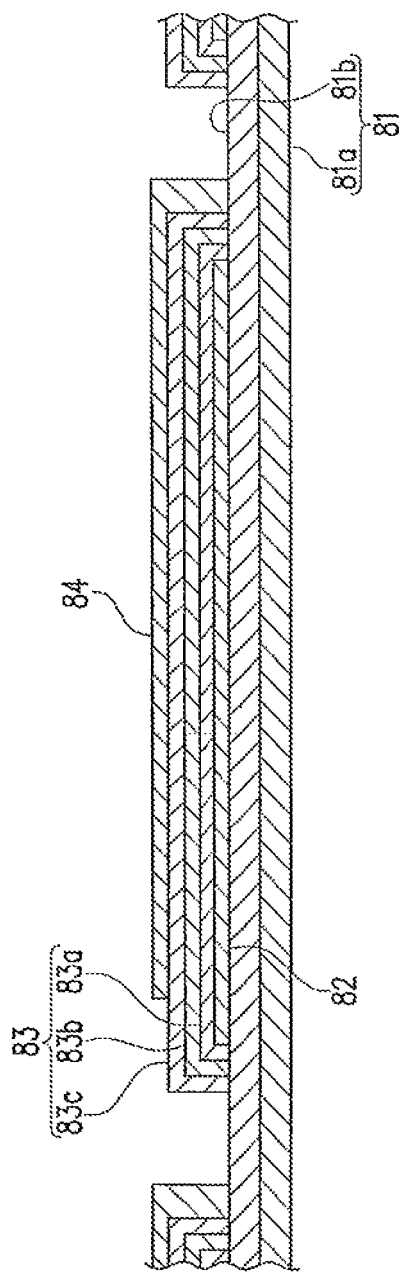
FIG. 7 is an enlarged sectional view taken along the line VII-VII of FIG. 6.

As shown in FIGS. 6 to 8, the organic EL device 8 includes a lower electrode layer 82 formed by deposition of the vaporized material from the evaporation source 4 onto a surface on one side of the substrate 81, an organic layer 83 formed by deposition of the vaporized material over the lower electrode layer 82, and an upper electrode layer 84 formed by deposition of the vaporized material over the organic layer 83. The organic EL device 8 includes a part on which no vaporized material is deposited, that is, a part provided without the layers 82, 83, and 84, across the width direction of the substrate 81.

The substrate 81 includes: a conductive layer 81a having a conductivity; and an insulation layer 81b having an insulating property. The conductive layer 81a is composed of a metal substrate, and is formed, for example, of a metal such as stainless steel, copper, and nickel. Further, the insulation layer 81b is arranged so as to cover the entire surface on one side of the conductive layer 81a, and is formed, for example, of thin glass or a photocurable resin such as polyimide resin, polyester resin, and epoxy resin.

The lower electrode layer 82 is arranged so that at least a part thereof is not covered by the organic layer 83 and the upper electrode layer 84 so as to be exposed. The lower electrode layer 82 serves as an anode layer in this embodiment, and is formed, for example, of a transparent conductive material such as indium-zinc oxide (IZO) and indium-tin oxide (ITO), or a metal such as gold, silver, and aluminum.

The organic layer 83 includes: a hole injection layer 83a disposed on the lower electrode layer 82; an organic EL layer 83b disposed on the hole injection layer 83a; and an electron injection layer 83c disposed on the organic EL layer 83b. The organic layer 83 is disposed between the lower electrode layer 82 and the upper electrode layer 84 so as to prevent contact between the lower electrode layer 82 and the upper electrode layer 84.

The hole injection layer 83a is formed, for example, of copper phthalocyanine (CuPc) or 4,4'-bis[N-4-(N,N-di-m-tolylamino)phenyl]-N-phenylamino]biphenyl (DNTPD). Further, the organic EL layer 83b is formed, for example, of tris (8-hydroxyquinoline) aluminum (Alq3) or 4,4'-N,N'-dicarbazolyl biphenyl (CBP) doped with an iridium complex (Ir(ppy)3). Further, the electron injection layer 83c is formed, for example, of lithium fluoride (LiF), cesium fluoride (CsF), or lithium oxide ($Li_2O$).

The upper electrode layer 84 serves as a cathode layer in this embodiment. The upper electrode layer 84 is formed, for example, of aluminum, silver, magnesium silver alloy, or an alloy containing alkali metal or alkaline earth metal.

Accordingly, the evaporation source 4 arranged in the vacuum chamber 1 on the upstream side discharges the vaporized material that forms the lower electrode layer 82; the evaporation sources 4 arranged in the vacuum chamber 1 in the middle respectively discharge, from the upstream side, the vaporized material that forms the hole injection layer 83a, the vaporized material that forms the organic EL layer 83b, and the vaporized material that forms the electron injection layer 83c; and the evaporation source 4 arranged in the vacuum chamber 1 on the downstream side discharges the vaporized material that forms the upper electrode layer 84.

As described above, in the method and the apparatus for manufacturing an organic EL device according to this embodiment, the shielding portion 51 is located at the shield position so as to shield the substrate 81 by being arranged between the corresponding evaporation source 4 and the substrate 81. This can prevent deposition of the vaporized material onto the part other than a predetermined part on which the vaporized material is supposed to be deposited, within the substrate 81 shielded by the shielding portion 51.

Further, the shielding portion 51 is withdrawn from between the evaporation source 4 and the substrate 81 by the switching mechanism 52, and thereby the shielding portion 51 is switched to the shield release position so as to release the shielding of the substrate 81.

This makes it possible to convey the substrate 81, without preventing deposition of the vaporized material discharged from each evaporation source 4 onto a predetermined part of the substrate 81 that is being transported. Accordingly, the vaporized material can be deposited onto the substrate 81 in a desired pattern, while eliminating the need for such a strip-shaped shadow mask as conventionally required.

Further, in the method and the apparatus for manufacturing an organic EL device according to this embodiment, the shielding portion 51 has a larger dimension than the width dimension of the substrate 81, so that the shielding portion 51 is arranged across the width direction of the substrate 81 when being located at the shield position. This allows a part onto which no vaporized material is deposited to be formed across the width direction of the substrate 81. Therefore, cutting of the organic EL device can be performed along such a part in a subsequent step.

Further, in the method and the apparatus for manufacturing an organic EL device according to this embodiment, use of a flip-type shield plate as the shielding portion enables its position to be securely switched between the shield position and the shield release position.

It is a matter of course that the method and the apparatus for manufacturing an organic EL device according to the present invention are not limited to the above-mentioned embodiments, and can be variously modified without departing from the gist of the present invention.

Figure 9:
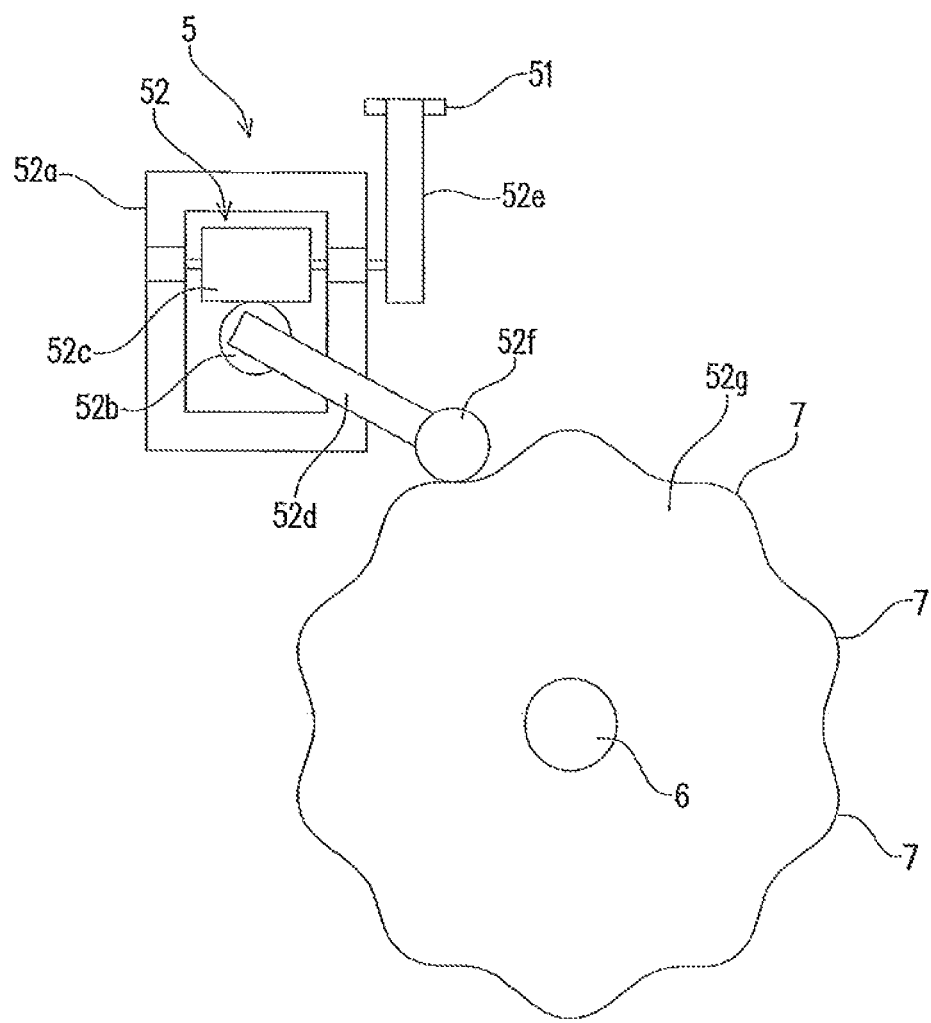
FIG. 9 is a side sectional view of a main part of an apparatus for manufacturing an organic EL device according to another embodiment of the present invention.

For example, FIG. 9 shows a possible configuration in which: a plurality of projections and depressions are provided on the outer circumferential surface of the cam 52g, so that the shielding portion 51 is switched between the shield position and the shield release position every time when the cam follower 42f passes through each projection 7 of the cam 52g, and film formation by a plurality of times of depositions is achieved by one revolution of the can roller 3.

Further, the method and the apparatus for manufacturing an organic EL device according to the above-mentioned embodiment described herein has a configuration in which the shielding portion 51 is formed into a strip shape or a rectangular shape, which however is not restrictive.

Figure 10:
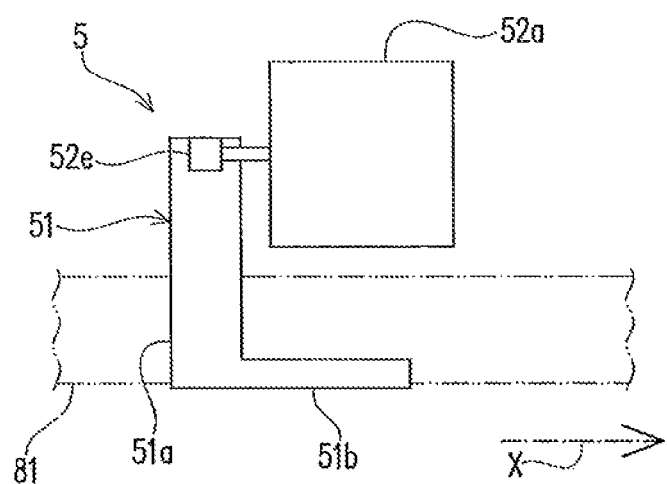
FIG. 10 is a plan view of a main part of an apparatus for manufacturing an organic EL device according to another embodiment of the present invention.

Specifically, as shown in FIG. 10, the shielding portion 51 may be configured to have: a first shielding portion 51a provided substantially orthogonal to the substrate 81; and a second shielding portion 51b provided substantially orthogonal to the first shielding portion 51a.

As shown in FIG. 10, the first shielding portion 51a is configured to have a strip shape or a rectangular shape. The first shielding portion 51a has one end portion coupled to the second linking member 52e of the switching mechanism 52 and the other end portion formed integrally with the second shielding portion 51b. The second shielding portion 51b is configured to have a strip shape or a rectangular shape. The second shielding portion 51b is provided along the longitudinal direction of the substrate 81, while overlapping one end portion in the width direction of the substrate 81.

As shown in FIG. 11, the shielding portion 51 may be configured to have a third shielding portion 51c, in addition to the first shielding portion 51a and the second shielding portion 51b shown in FIG. 10. The third shielding portion 51c is configured to have a strip shape or a rectangular shape. The third shielding portion 51c is formed to project from an intermediate portion of the first shielding portion 51a so as to be substantially orthogonal to the first shielding portion 51a. While the second shielding portion 51b is provided so as to overlap the one end portion in the width direction of the substrate 81, the third shielding portion 51c is provided so as to overlap the other end portion on the opposite side in the width direction of the substrate 81. The third shielding portion 51c is substantially in parallel to the second shielding portion 51b. The third shielding portion 51c is provided along the longitudinal direction of the substrate 81.

Alternatively, the shielding portion 51 may be configured to have a fourth shielding portion 51d, as shown in FIG. 12, in addition to the first shielding portion 51a, the second shielding portion 51b, and the third shielding portion 51c shown in FIG. 11. The fourth shielding portion 51d is configured to have a strip shape or a rectangular shape. The fourth shielding portion 51d couples an end portion of the second shielding portion 51b and an end portion of the third shielding portion 51c to each other. The fourth shielding portion 51d is substantially in parallel to the first shielding portion 51a. Further, the fourth shielding portion 51d is provided along the width direction of the substrate 81. With such a configuration as mentioned above, the shielding portion 51 shown in FIG. 12 is composed of the first shielding portion 51a, the second shielding portion 51b, the third shielding portion 51c, and the fourth shielding portion 51d, so as to have a quadrangular shape. The shielding portion 51 has one opening surrounded by the first shielding portion 51a to the fourth shielding portion 51d.

Alternatively, the shielding portion 51 may be configured to have a fifth shielding portion 51e, as shown in FIG. 13, in addition to the first shielding portion 51a to the fourth shielding portion 51d shown in FIG. 12. The fifth shielding portion 51e is configured to have a strip shape with its intermediate portion being bent. The fifth shielding portion 51e is provided between the second shielding portion 51b and the third shielding portion 51c. The fifth shielding portion 51e couples an intermediate portion of the first shielding portion 51a and an intermediate portion of the fourth shielding portion 51d to each other. The fifth shielding portion 51e is provided so as to be substantially orthogonal to the first shielding portion 51a and the fourth shielding portion 51d. Further, the fifth shielding portion 51e is provided along the longitudinal direction of the substrate 81. With such a configuration as mentioned above, the shielding portion 51 has two openings defined by the first shielding portion 51a to the fifth shielding portion 51e.

Further, in the method and the apparatus for manufacturing an organic EL device according to the present invention, the switching mechanism 5 is not limited to one having a configuration according to the above-mentioned embodiments, and needs only to have a configuration capable of switching the shielding portion 51 between the shield position and the shield release position.

Figure 14:
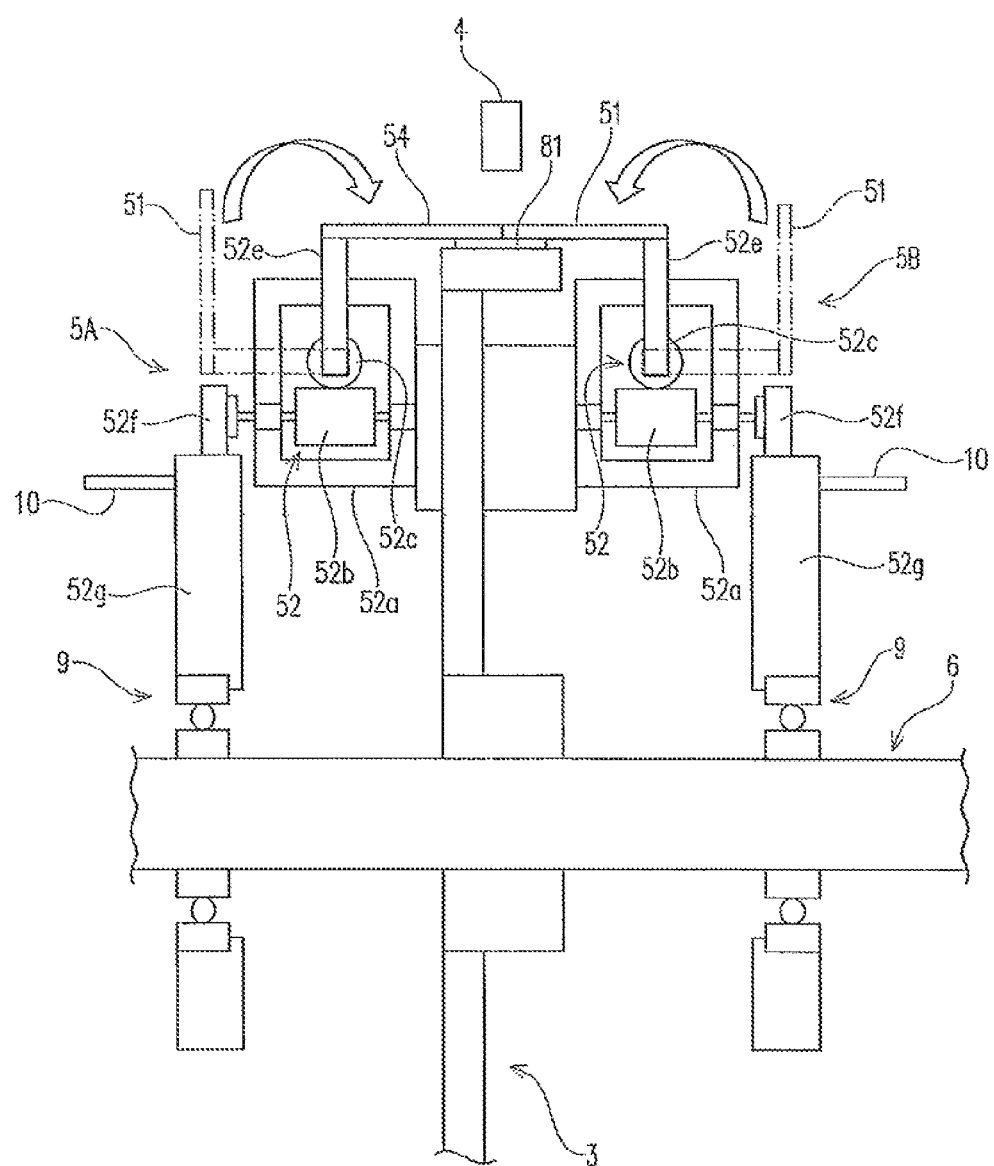
FIG. 14 is a side sectional view of an apparatus for manufacturing an organic EL device according to another embodiment of the present invention.

It is also possible, for example, to provide shielding units 5A and 5B on both sides, that is, one surface side (front side) and the other surface side (back side), of each can roller 3, in the apparatus for manufacturing an organic EL device according to the present invention. For example, as shown in FIG. 14, the manufacturing apparatus includes: a first shielding unit 5A provided on one surface side of the can roller 3; and a second shielding unit 5B provided on the other surface side. The first shielding unit 5A and the second shielding unit 5B are configured to have the same shape.

The first shielding unit 5A and the second shielding unit 5B move to the shield position or the shield release position at the same timing. The cam 52g provided in each of the first shielding unit 5A and the second shielding unit 5B is supported rotatably relative to the drive shaft 6 via a bearing 9. Each cam 52g is fixed to the inside of the corresponding vacuum chamber 1 via a fixing member 10. That is, the cam 52g is fixed to the inside of the vacuum chamber 1 so as to be rotatable relative to the drive shaft 6 but so as not to rotate on itself. The shielding portion 51 of the first shielding unit 5A is configured to shield about half region in the width direction of the substrate 81 at the shield position (position depicted by a solid line in FIG. 14). The shielding portion 51 of the second shielding unit 5B is configured to shield the other about half region of the substrate that remains not shielded by the shielding portion 51 of the first shielding unit 5A.

Figure 15:
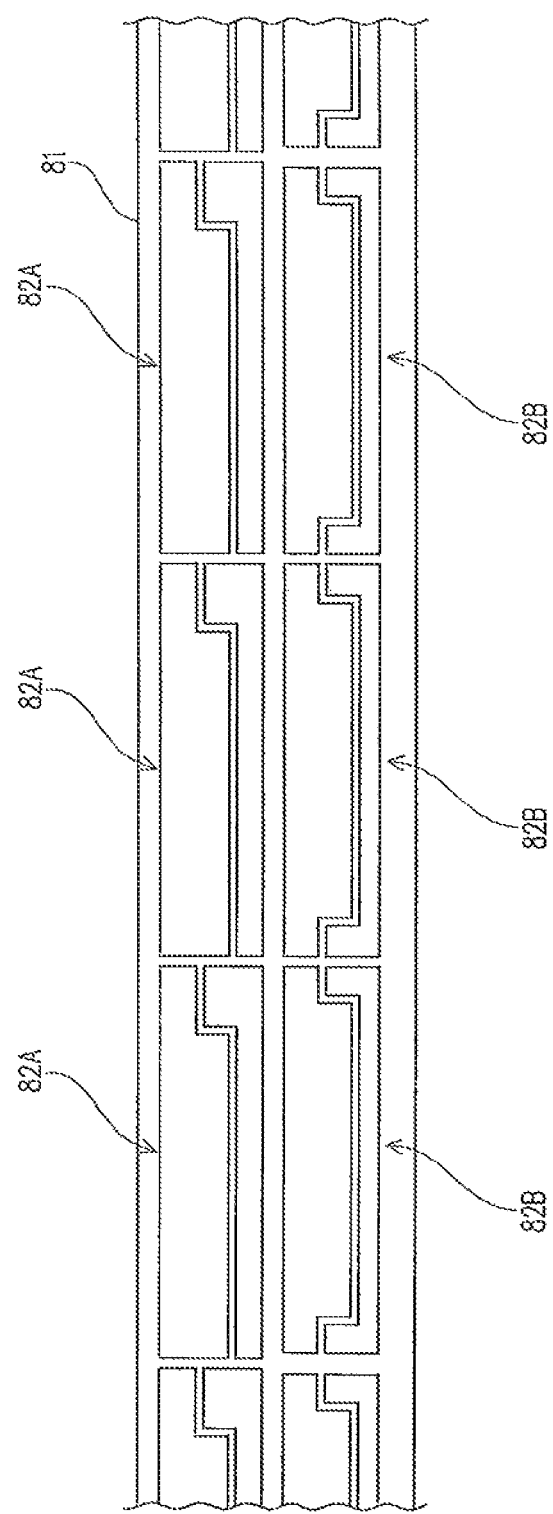
FIG. 15 is a plan view of a substrate having a lower electrode layer formed by the manufacturing apparatus according to the embodiment of FIG. 14.

FIG. 15 shows an example of the lower electrode layer 82 formed over the substrate 81 using the manufacturing apparatus with the above-mentioned configuration. As shown in FIG. 15, a row of the first lower electrode layers 82A formed using the first shielding unit 5A and a row of the second lower electrode layers 82B formed using the second shielding unit 5B are formed over the substrate 81.

Figure 16:
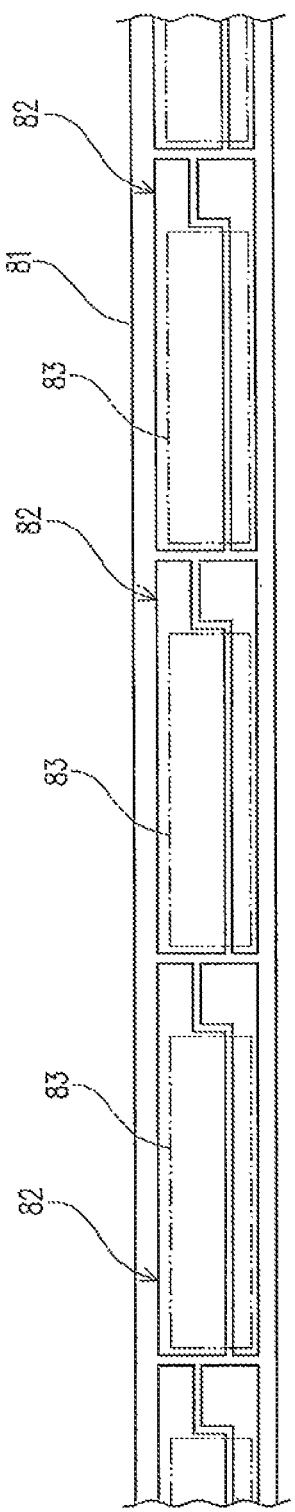
FIG. 16 is a plan view of a substrate having a lower electrode layer and an organic layer formed by the manufacturing apparatus according to the present invention.

In the manufacturing apparatus according to the example of FIG. 14, the lower electrode layers 82A and 82B are formed respectively using the first shielding unit 5A and the second shielding unit 5B at the same timing. However, the timings of shielding by the first shielding unit 5A and the second shielding unit 5B may be different from each other. Further, the first shielding unit 5A and the second shielding unit 5B may be arranged at different positions in the rotation direction of the can roller 3. In this way, the timing when the first shielding unit 5A shields the substrate 81 and the timing when the second shielding unit 5B shields the substrate 81 can be made different from each other. Accordingly, it is made possible, for example, to form the lower electrode layer 82 over the substrate 81 using the first shielding unit 5A, followed by formation of the organic layer 83 over the lower electrode layer 82 using the second shielding unit 5B, as shown in FIG. 16.

EXAMPLES

Next, the present invention is further described in detail with reference to Examples. However, the present invention is not limited to these Examples.

Example 1

Using a manufacturing apparatus with the following conditions, an anode layer, an organic EL layer, and a cathode layer were formed over a substrate to produce organic EL devices. A material made of SUS304 with a thickness of 0.1 mm was employed as a shielding portion. A can roller with a diameter of 600 mm was used. A vacuum chamber with a degree of vacuum thereinside of $5.0 \times 10^{-5}$ Pa was used. A substrate with a width dimension of 50 mm was used. The substrate was conveyed at a speed of 1 m/min. A material made of SUS304 with a thickness of 50 μm was employed as the substrate. An insulation layer with a thickness of 4 μm was formed over the substrate on the organic EL device side.

The organic EL devices produced with the above-mentioned conditions were cut out with scissors along the width direction of the substrate at the center between each adjacent organic EL devices in the longitudinal direction of the substrate, thereby separating the organic EL devices from each other. Then, a voltage was applied to the anode layer and the cathode layer of each organic EL device, as a result of which green light emission in an area with a length of 314 mm in the longitudinal direction of the substrate and a length of 38 mm in the width direction of the substrate was observed from every organic EL device. The light emission within that area was uniform. Further, no flaws such as short-out were observed in the organic EL devices. In Example 1, ten organic EL devices were produced, and desired light emission was achieved in all the devices.

Comparative Example

Organic EL devices as Comparative Example were produced by a manufacturing apparatus that uses a strip-shaped shadow mask instead of using the shielding unit of Example 1. The strip-shaped shadow mask is wound around a shadow mask-unwinding roller. The strip-shaped shadow mask unwound from the shadow mask-unwinding roller is supplied between a can roller and an evaporation source, and then wound up by a shadow mask-winding roller. The shadow mask has openings formed at a specific pitch. The shadow mask thus unwound is brought into close contact with the substrate by a pressure roller.

Using such a manufacturing apparatus provided with the strip-shaped shadow mask, an organic EL layer and a cathode layer were formed over an anode layer that had been formed over the substrate, in the same manner as in Example 1. As a result, the shadow mask and the anode layer over the substrate were rubbed against each other, and thus the anode layer was damaged. More specifically, one among the produced ten organic EL devices had a damage on its anode layer. Further, a positional displacement occurred between the respective openings of the strip-shaped shadow mask and the anode layer in the course of continuous film formation, after which it was impossible to produce organic EL devices with desired quality.

The present inventors conducted a performance test for the organic EL device according to the above-mentioned Example 1 and the organic EL device according to Comparative Example that had a damage in the anode layer. As a test result, FIG. 17 shows that the emission brightness of the organic EL device according to Example 1 gradually increased after the applied voltage had exceeded about 7 V, and hence exceeded 40000 cd/m$^2$ when the applied voltage reached 12 V, where a desired emission brightness was achieved. In contrast, it was revealed that, in the organic EL device according to Comparative Example which had an operation failure, the emission brightness gradually increased after the applied voltage had exceeded about 7 V, however, to fail to reach the desired emission brightness even when the applied voltage reached 12 V. From these results, it is assumed that Comparative Example failed to exert desired performance because of the damage in the anode layer.

Figure 19:
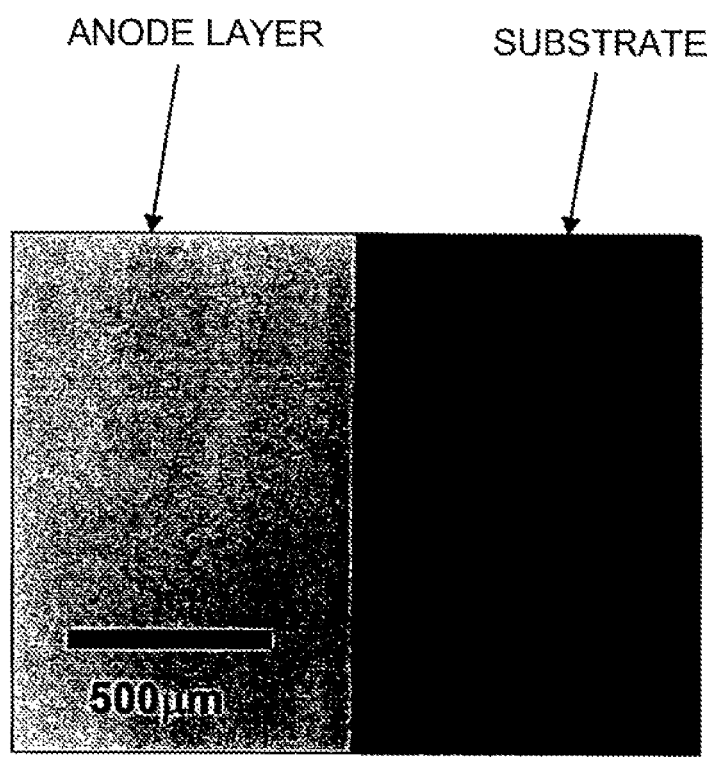
FIG. 19 is a partial planar image of Comparative Examples of the organic EL device.

Further, as shown in FIG. 18 and FIG. 19, a planar image of the boundary portion between the substrate and the anode layer formed over the substrate was obtained for each of Example 1 and Comparative Example, using a laser microscope (VK-9700, manufactured by KEYENCE CORPORATION). Then, each image was compared with the other. Further, as shown in FIG. 20, a graph was plotted from the cross sectional profile of pattern edge of the anode layer in each of Example 1 and Comparative Example, and comparison was performed.

In Example 1, while the shielding portion of the shielding unit was arranged at the shield position that was distant from the substrate, the anode layer was formed by deposition of the vaporized material from the evaporation source onto the substrate. On the other hand, in Comparative Example, shielding was performed while the shadow mask was held in contact with the substrate, and the anode layer was formed by deposition of the vaporized material from the evaporation source onto the substrate.

Figure 20:
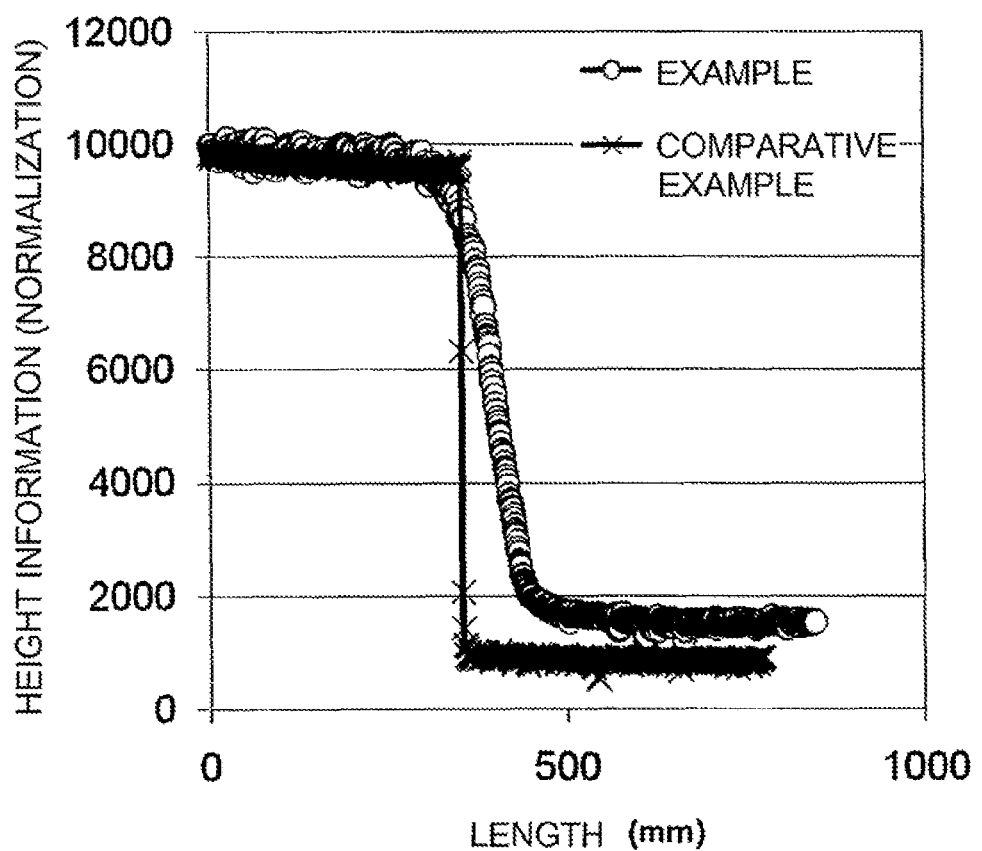
FIG. 20 is a graph showing a cross-sectional profile of an organic EL device.

As shown in FIG. 20, the pattern edge of the anode layer of Comparative Example had a side surface formed linearly, substantially along the vertical direction. In contrast, the pattern edge of the anode layer of Example 1 had a side surface formed into a curve at an angle from the vertical direction.

With this regard, referring further to FIG. 19, the boundary between the substrate and the anode layer shows up clearly on the color line in the planar image of Comparative Example, because the side surface of the anode layer was formed almost vertically, as mentioned above. In contrast, in the planar image of Example 1 (FIG. 18), the boundary between the substrate and the anode layer is unclear, which seems slightly blurred, because the side surface of the anode layer was formed at an angle.

It is understood from the above description that, in Comparative Example, deposition of the vaporized material was performed for the anode layer with the shadow mask being held in contact with the substrate, resulting in a very sharpened pattern edge of the anode layer (shown in FIG. 19 and FIG. 20). In such Comparative Example, a so-called edge leakage is likely to occur, which is not preferable. This fact has demonstrated that the method and the apparatus for manufacturing an organic EL device according to Example 1 exert a remarkable effect in preventing the occurrence of edge leakage by performing deposition with the shielding portion maintained at a distance from the substrate when forming the anode layer over the substrate.

REFERENCE SIGNS LIST

1: Vacuum chamber
2: Transporting unit
3: Can roller
4: Evaporation source
5: Shielding unit
8: Organic EL device
51: Shielding portion
52: Switching mechanism
81: Substrate
82: Lower electrode layer
83: Organic layer
84: Upper electrode layer
X: Transporting direction

The invention claimed is:

1. A method for manufacturing an organic EL device, comprising the steps of:
   providing a substrate having a strip shape while the substrate is in contact with a roller;
   depositing a vaporized material onto a predetermined part of the substrate by discharging the vaporized material from an evaporation source; and
   arranging a shielding portion for shielding the substrate between the evaporation source and the substrate so as to prevent the deposition of the vaporized material onto a part other than the predetermined part during the deposition of the vaporized material,
   wherein the shielding portion is switchable between a shield position where the shielding portion is arranged between the evaporation source and the substrate so as to shield the substrate and a shield release position where the shielding portion is withdrawn from between the evaporation source and the substrate so as to release the shielding of the substrate, and
   wherein the shielding portion is switched between the shield position and the shield release position while rotating together with the roller.

2. The method for manufacturing an organic EL device according to claim 1, wherein
   the shielding portion has a larger dimension than a width dimension of the substrate so as to be arranged across a width direction of the substrate when being located at the shield position.

3. The method for manufacturing an organic EL device according to claim 1, wherein
   the shielding portion is a flip-type shield plate.

4. An apparatus for manufacturing an organic EL device, comprising:
   a roller in contact with a substrate having a strip shape;
   an evaporation source for discharging a vaporized material toward a predetermined part of the substrate so that the vaporized material is deposited onto the substrate; and
   a shielding unit for shielding the substrate so as to prevent the deposition of the vaporized material onto a part other than the predetermined part,
   wherein the shielding unit comprises:
   a shielding portion for shielding the substrate; and
   a switching mechanism capable of switching the shielding portion between a shield position where the shielding portion is arranged between the evaporation source and the substrate so as to shield the substrate and a shield release position where the shielding portion is withdrawn from between the evaporation source and the substrate so as to release the shielding of the substrate,
   wherein the shielding portion is switched between the shield position and the shield release position by the switching mechanism while rotating together with the roller.

5. The method for manufacturing an organic EL device according to claim 1, wherein
   the evaporation source discharges the vaporized material toward a part of the substrate in which the part is in contact with the roller.

6. The apparatus for manufacturing an organic EL device according to claim 4, wherein
   the evaporation source discharges the vaporized material toward a part of the substrate in which the part is in contact with the roller.

* * * * *